United States Patent
Hedler et al.

(10) Patent No.: US 9,884,759 B2
(45) Date of Patent: *Feb. 6, 2018

(54) THERMOELEMENT INCLUDING A THREE-DIMENSIONAL MICROSTRUCTURE, AND METHOD FOR PRODUCING A THERMOELEMENT

(75) Inventors: Harry Hedler, Germering (DE); Jörg Zapf, München (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 13/499,083

(22) PCT Filed: Sep. 20, 2010

(86) PCT No.: PCT/EP2010/063811
§ 371 (c)(1),
(2), (4) Date: Mar. 29, 2012

(87) PCT Pub. No.: WO2011/039070
PCT Pub. Date: Apr. 7, 2011

(65) Prior Publication Data
US 2012/0183732 A1    Jul. 19, 2012

(30) Foreign Application Priority Data
Sep. 29, 2009 (DE) .................. 10 2009 043 414

(51) Int. Cl.
B32B 3/00 (2006.01)
G01K 7/02 (2006.01)
(Continued)

(52) U.S. Cl.
CPC .. *B81C 99/0085* (2013.01); *B81B 2203/0361* (2013.01); *B81B 2207/056* (2013.01); *Y10T 29/49826* (2015.01); *Y10T 428/24355* (2015.01)

(58) Field of Classification Search
CPC ........... A61B 17/3203; A61B 18/1477; A61M 37/0015; A61M 2037/0046; A61N 1/0472;
(Continued)

(56) References Cited

U.S. PATENT DOCUMENTS 5,808,233 A * 9/1998 Finkel .................. C21D 1/00
136/200
6,551,849 B1 4/2003 Kenney
(Continued)

FOREIGN PATENT DOCUMENTS

DE    102005061411       6/2007
DE    102006055263 A1    5/2008
(Continued)

OTHER PUBLICATIONS

S. Rajaraman et al., "A unique fabrication approach for microneedles using coherent porous silicon technology," Sensors and Actuators B: Chemical, vol. 105, Issue 2, 2005, pp. 443-448.
(Continued)

*Primary Examiner* — Joanna Pleszczynska
(74) *Attorney, Agent, or Firm* — Slayden Grubert Beard PLLC

(57) ABSTRACT

A three-dimensional micro-structure has a plurality of adjacent micro-columns which are arranged at a distance from each other and essentially parallel in relation to the respective longitudinal extension. The micro-columns are made of at least one micro-column material having respectively an aspect ratio in the region of 20-1000 and respectively a
(Continued)

micro-column diameter in the region of 0.1 µm-200 µm. A micro-column intermediate chamber is arranged between adjacent micro-columns having a micro-column distance selected from between the adjacent micro-columns in the region of 1 µm-100 µm. According to a method for producing the three-dimensional micro-structures: a) a template is provided with template material, b) the micro-column material is arranged in the column-like cavities, and c) the template is at least partially removed.

16 Claims, 13 Drawing Sheets

(51) Int. Cl.

| | | |
|---|---|---|
| *G01K 7/08* | (2006.01) | |
| *B81B 1/00* | (2006.01) | |
| *B81B 7/00* | (2006.01) | |
| *B81B 7/02* | (2006.01) | |
| *B81B 7/04* | (2006.01) | |
| *H01L 35/32* | (2006.01) | |
| *B29C 39/00* | (2006.01) | |
| *B29C 39/02* | (2006.01) | |
| *B81C 99/00* | (2010.01) | |

(58) Field of Classification Search
CPC ..... H01L 31/0232; H01L 27/12; H01L 23/49; H01L 35/32; H01L 35/325; H01L 35/30; H01L 2224/16225; B81B 2207/05; B81B 2207/056; B81B 2203/04; B81B 2201/0278; B81B 2203/0361–2203/0392; G01K 7/04; G01K 7/08; G01K 7/186; G01K 7/226; G01K 1/14; G01K 7/021; Y10T 428/24174; Y10T 428/24355; B29C 39/00; B29C 39/02; B32B 3/00; B32B 3/10; B32B 3/30; B32B 15/04; B32B 15/043; B23P 11/00
USPC ....... 428/119, 120, 141, 156, 172, 600, 687; 604/272, 273; 324/658; 429/235, 237; 374/163, 179, 185, 208
See application file for complete search history.

(56) References Cited

U.S. PATENT DOCUMENTS

| | | | |
|---|---|---|---|
| 6,597,051 B2 | 7/2003 | Lubomirsky et al. | |
| 7,829,380 B2 | 11/2010 | Irsigler et al. | |
| 8,535,962 B2 | 9/2013 | Gilet et al. | |
| 2003/0025174 A1 | 2/2003 | Lubomirsky et al. | |
| 2004/0260251 A1* | 12/2004 | Chang et al. | 604/272 |
| 2006/0040390 A1* | 2/2006 | Minor et al. | 435/455 |
| 2006/0076718 A1* | 4/2006 | Sherman et al. | 264/504 |
| 2007/0059584 A1 | 3/2007 | Nakano et al. | |
| 2007/0077396 A1* | 4/2007 | Aizenberg et al. | 428/172 |
| 2007/0148653 A1 | 6/2007 | Yoshida | |
| 2007/0190786 A1 | 8/2007 | Murao et al. | |
| 2008/0099925 A1 | 5/2008 | Irsigler et al. | |
| 2008/0319298 A1* | 12/2008 | Huys | G01N 33/48728 600/377 |
| 2009/0246901 A1 | 10/2009 | Gilet et al. | |
| 2010/0310773 A1 | 12/2010 | Yoshida et al. | |

FOREIGN PATENT DOCUMENTS

| | | |
|---|---|---|
| DE | 10 2009 043 414.3 | 9/2009 |
| FR | 2 902 237 | 12/2007 |
| JP | 7-283444 | 10/1995 |
| JP | 10-50576 | 2/1998 |
| JP | 11-274592 | 10/1999 |
| JP | 2004-182537 | 7/2004 |
| JP | 2005-189128 | 7/2005 |
| JP | 2005-207901 | 8/2005 |
| JP | 2006-93364 | 4/2006 |
| JP | 2007-80609 | 3/2007 |
| JP | 2008-264959 | 11/2008 |
| TW | 200820375 | 5/2008 |
| WO | 2009/113856 | 9/2009 |
| WO | PCT/EP2010/063811 | 9/2010 |

OTHER PUBLICATIONS

Patrick Griss et al., "Micromachined barbed spikes for mechanical chip attachment," Sensors and Actuators A: Physical, vol. 95, 2002, pp. 94-99.
Hontao Han et al., "Micromechanical Velcro," Journal of Microelectromechanical Systems, vol. 1, No. 1 Mar. 1992, pp. 37-43.
Jung-Hawn Park et al., "Polymer particle-based micromolding to fabricate novel microstructures," Biomed Microdevices, 2007, 9, pp. 223-234.
Ryoichi Yamamoto et al., "Preparation of microstructure bodies in freestanding diamond-like carbon foil prepared using plasma-based ion implantation," Diamond & Related Materials, 16, 2007, pp. 292-295.
N. Wilke et al., "Silicon microneedle electrode array with temperature monitoring for electroporation," Sensors and Actuators A: Physical, 123-124, 2005, pp. 319-325.
Mohammad Reza Abidian et al., "Experimental and theoretical characterization of implantable neural microelectrodes modified with conducting polymer nanotubes," Biomaterials, Mar. 2008, 29(9), 24 Pages.
L. Wang et al., "High aspect ratio through-wafer interconnections for 3D-microsystems," MEMS 2003, Kyoto, Japan, vol. 16, Jan. 19, 2003, pp. 634-637, IEEE.
Sonia E. Létant et al., "Nanochannel Arrays on Silicon Platforms by Electrochemistry," Nano Letters, ACS, vol. 4, No. 9, 2004, pp. 1705-1707.
International Search Report for PCT/EP2010/063811, dated Apr. 1, 2011.
German Office Action for German Priority Patent Application No. 10 2009 043 414.3, dated Jan. 11, 2010.
German Office Action for German Priority Patent Application No. 10 2009 043 414.3, dated Jun. 8, 2011.
M. C. Liu et al., "A Nanoscaled Underlayer Confinement Approach for Achieving Extraordinarily Plastic Amorphous Thin Film", Scripta Materialia, Elsevier, vol. 61, Issue 8, Jul. 16, 2009, pp. 840-843.
Chinese Office Action dated Dec. 20, 2013 in corresponding Chinese Application No. 201080043476.3.
German Office Action dated Feb. 28, 2014 in corresponding German Application No. 102009043414.3.
German translation of Japanese Office Action dated Oct. 21, 2013 in corresponding Japanese Application No. 2012-531323.
Japanese Office Action dated Sep. 8, 2014 in corresponding Japanese Patent Application No. 2012-531323.
European Office Action dated Oct. 26, 2015 from corresponding European Patent Application No. 10760290.6.
European Office Action dated Mar. 23, 2015 in corresponding European Patent Application No. 10760290.6.
Chinese Office Action dated Apr. 7, 2015 in corresponding Chinese Patent Application No. 201080043476.3.

* cited by examiner

FIG 10
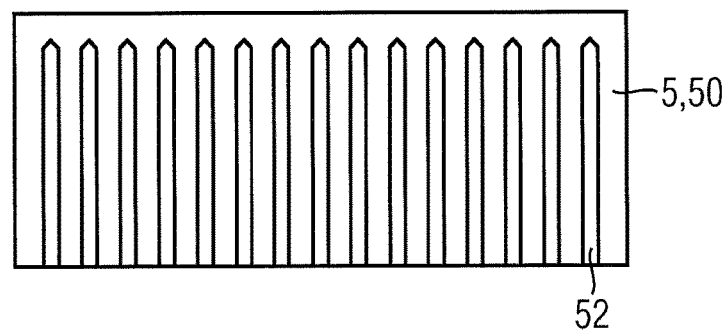
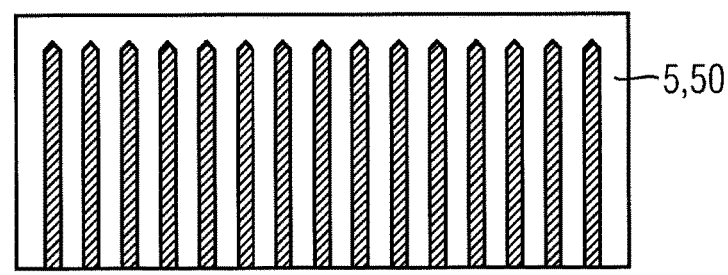
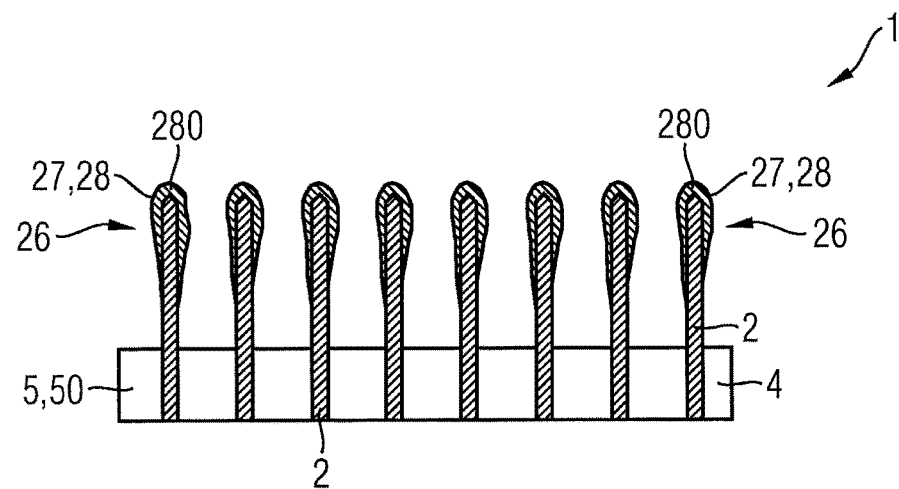

THERMOELEMENT INCLUDING A THREE-DIMENSIONAL MICROSTRUCTURE, AND METHOD FOR PRODUCING A THERMOELEMENT

CROSS REFERENCE TO RELATED APPLICATIONS

This application is based on and hereby claims priority to International Application No. PCT/EP2010/063811 filed on Sep. 20, 2010 and German Application No. 10 2009 043 414.3 filed on Sep. 29, 2009, the contents of which are hereby incorporated by reference.

BACKGROUND

The invention relates to a three-dimensional micro-structure and a method for producing a micro-structure.

For various applications, a structure with a very large surface is of advantage. A structure of this kind is, for example, a porous structure. A property of a structure of this kind, for example a material composition of the structure, can only be varied to a limited degree.

SUMMARY

It is one potential object to provide a structure with a very large surface whose properties can be changed within a wide range.

The inventors propose a three-dimensional micro-structure comprising a plurality of adjacent micro-columns which are arranged at a distance from each other and substantially parallel in relation to the respective longitudinal extension with at least one amorphous micro-column material having respectively an aspect ratio in the region of 20 to 1000 and respectively a micro-column diameter in the region of 0.1 μm to 200 μm and a micro-column intermediate chamber arranged between adjacent micro-columns having a micro-column distance between the adjacent micro-columns selected from the region of 1 μm to 100 μm. Here, the micro-column diameter is in particular selected from the region of 0.3 μm to 200 μm. Here, a substantially parallel arrangement of the micro-columns means that, with respect to the (averaged) orientation of the micro-column longitudinal extensions, there can be deviations of up to 10°.

Preferably, the micro-column longitudinal extension of at least one of the micro-columns is selected from the region of 50 μm to 10 mm and in particular from the region of 100 μm to 1 mm. Preferably, the micro-column longitudinal extensions (thread lengths) of a plurality of the micro-columns or all the micro-columns are within the named regions. Here, the micro-columns can be of the same length. It is also conceivable for the micro-columns of a micro-structure to have different lengths, that is different micro-column longitudinal extensions.

The inventors also propose a method for producing the three-dimensional micro-structure with following steps: a) the provision of a template with template material, wherein the template has a three-dimensional template structure with column-like template cavities which is substantially inverse to the micro-structure, b) the arrangement of micro-column material in the column-like cavities so that the micro-columns are formed and template cavities so that the micro-columns are formed and c) the at least partial removal of the template material.

Preferably, the following further steps are performed for the arrangement of the micro-column material: d) introduction of starting material for the micro-column material in the template cavities and e) conversion of the starting material for the micro-column material into the micro-structure material.

The amorphous micro-column material is a non-single-crystal material. For example, the micro-column material is polycrystalline or non-crystalline. Here, any material is conceivable as the micro-column material, for example metals, semimetals and any inorganic and organic compounds.

According to a third aspect of the invention, an arrangement of at least two micro-structures is disclosed, wherein the micro-columns of one of the micro-structures are arranged in the micro-column intermediate chambers of the other micro-structure and vice versa.

The proposals provide a brush-like, three-dimensionally structured micro-structure comprising extremely thin and simultaneously self-supporting micro-columns (threads, needles) in a (systematic) matrix-like arrangement. The micro-structure is self-supporting. It does not require a bearing surface to support the micro-structure. The micro-structure comprises a grid with grid points. The grid points are formed by the micro-columns. A micro-structure of this kind also has an extremely large surface. Hitherto, there has been no method for producing a micro-structure of this kind with a thread-grid of less than 10 μm with a thread length of up to 1000 μm and more.

The basic idea for the production of the micro-structure relates to using a template (matrix) to provide a template structure (matrix structure) with template cavities inverse to the micro-structure. With respect to their template cavity longitudinal extensions, the template cavities are oriented substantially parallel to each other and have respectively an aspect ratio in the region of 20 to 1000 and respectively a template cavity diameter in the region of 0.1 μm to 200 μm. Accordingly, the micro-structure also has a distance between the adjacent template cavities of 1 μm to 100 μm.

The template cavity diameter corresponds to the micro-column diameter and the template cavity longitudinal extension to the micro-column longitudinal extension. The aspect ratios of the micro-columns and the template cavities also match each other. Generally, the aspect ratio of a structure is the ratio of the height of the structure to a lateral extension of the structure, with respect to a template cavity, therefore, the ratio of the template cavity longitudinal extension to an (averaged) template cavity diameter and with respect to a micro-column, therefore, the ratio of the micro-column longitudinal extension to its (averaged) micro-column diameter.

The template cavities are, for example, filled with liquid micro-column material as a starting material or another liquid starting material for the micro-column material. Subsequently, the liquid material is converted into the solid micro-column material in the template cavities. The micro-columns are formed.

For example, liquid metal is introduced into the template cavities at a high temperature as the starting material. The temperature is then lowered. The liquid metal solidifies and the corresponding micro-columns are formed from the metal.

It is also conceivable for the template cavities to function as microreactors. In this case, liquid starting material is introduced into the template cavities. A subsequent chemical reaction results in the formation of the micro-column materials. The micro-columns are formed.

After the formation of the micro-columns, the template material is at least partially removed. This means that the micro-columns are partially or completely exposed.

According to a particular embodiment of the method, a template with silicon is used as the template material. For example, the method is performed with the aid of a silicon wafer. The silicon wafer functions as a template. Silicon is particularly suitable for the generation of the above-described column-like template cavities with the necessary aspect ratios. For this, the PAECE (photo assisted electrochemical etching) method is performed. The starting point of this method is the introduction of etch pits into a surface of the silicon wafer, for example, by photolithography. This surface-structured silicon wafer is exposed to an etching solution with hydrofluoric acid. Following exposure to an electric field and irradiation with light, the column-like template cavities are formed with extreme structural fidelity on the basis of the etch pits.

In a further embodiment, a template with a carrier with carrier material is used for the micro-structure. As a result, the plurality of micro-columns is arranged on a common carrier with the carrier material. Here, the carrier material can be elastic, for example an elastomer. For example, the carrier is a rubber band. After the removal of the template material, only the micro-structure remains arranged on the carrier. The rubber band can be elastically deformed. However, it is also conceivable for the carrier material to be inelastic. For example, the above-described silicon wafer functions not only as a template, but also as a carrier. After the production of the micro-structure, the silicon of the silicon wafer is only partially removed. The remaining silicon wafer serves as a carrier. The carrier material is the template material, in this case silicon.

After the removal of the template material, a functional layer with functional material is arranged at the end of the micro-columns. It is ensured that a functional layer with functional material is arranged at the ends of at least a part of the micro-columns. The functional layer can take on any functions. For example, the functional layer can be a protective layer for protecting the micro-structure. The functional layer can function as a support layer. The functional layer can also be embodied as a mechanical functional layer such that the micro-structure can be used as a connecting element, for example as connecting element in a Velcro fastener. However, other functional layers are also conceivable. For example, the functional layer can be an insulation layer with a dielectric functional material. Also conceivable is an electrically conductive functional layer with electrically conductive functional material. A functional layer of this kind connects the micro-columns in an electrically conductive way with each other, for example.

According to a further embodiment, at least one of the micro-columns comprises at least two sections arranged along the micro-column longitudinal extension with amorphous micro-column materials differing from each other. For example, the micro-column comprises two sections (part-sections) with different micro-column materials. This is achieved, for example, by the fact that the template cavities are first partially filled with a first micro-column material. Following the formation of the corresponding part-micro-columns, the regions of the template cavities remaining free are filled with a second micro-column material. The following conversion into the second micro-column material results in the formation of a micro-column with two sections made of different micro-column materials. It is also conceivable for the template cavities with the two micro-column materials to be filled from different sides and transferred to the respective micro-column materials in one single common process.

The micro-structure can comprise micro-columns with only one specific micro-column material. The result is a homogeneous, uniform micro-structure. However, it is also conceivable for a heterogeneous micro-structure made of different micro-column materials to be present. According to a particular embodiment, therefore, at least two of the micro-columns comprise amorphous micro-column materials differing from each other. This can be achieved, for example, in that, during the arrangement of one of the micro-column materials, part of the template cavities is covered. Then, the covered template cavities are filled with another micro-column material. The micro-column materials can again be simultaneously converted to the corresponding micro-columns in a common process. This result is a micro-structure with micro-columns with different micro-column materials. However, serial production of these micro-columns is also conceivable. This means that the first micro-column material is converted first before the second micro-column material is poured into in the previously covered template cavities and then converted.

In a further embodiment, at least one of the micro-columns comprises at least one enclosure with at least one enclosure material. The enclosure material of the enclosure and the micro-column material of the micro-column are different. The enclosure is for example, firmly connected to the micro-column. The micro-column forms a core, which is surrounded by the enclosure. Here, the micro-column can be only partially surrounded by the enclosure, for example at the end of the micro-column. The enclosure can only comprise more than just one layer, it can also be multilayered. For example, the enclosure can be used to adapt a shape of the micro-column. An enclosure arranged solely at the ends of micro-column results in a thickening of the end of the micro-column.

The enclosure can be applied, for example, by electrochemical deposition (in cases when the micro-column material is electrically conductive). It is also conceivable for the enclosure material to be applied to the surface of the micro-columns by a gas phase deposition method. The gas phase deposition method is, for example, a steam deposition method. A PVD (physical vapor deposition) method, such as sputtering or a CVD (chemical vapor deposition) method is also conceivable.

In a further embodiment, at least one intermediate chamber material is arranged in the micro-column intermediate chamber between the adjacent micro-columns. According to a further embodiment, the intermediate chamber material forms a coherent intermediate chamber layer by which the adjacent micro-structure columns are fixed. The intermediate chamber material is, for example, not firmly connected to the micro-columns. Its sole purpose is to hold the micro-columns together.

It is possible for only one single, coherent intermediate chamber layer to be present. It is also conceivable for at least two intermediate chamber materials, which respectively form at least one coherent layer, to be arranged in the micro-column intermediate chamber between the adjacent micro-columns. The result is a multilayer intermediate chamber layer.

In a further embodiment, at least one of the micro-columns comprises a micro-column cavity. The micro-column comprises a micro-column wall. In the interior of the micro-column wall, the micro-column is hollow. The micro-column is embodied as a hollow needle. The micro-column cavity results in a further enlargement of the surface of the micro-structure. Here, the micro-column cavity preferably extends along the entire micro-column longitudinal extension. However, it is also conceivable for the micro-column cavity to extend only partially along the micro-column longitudinal extension. The micro-column is only partially embodied as a hollow needle.

It is also possible for micro-column surfaces the micro-columns to be structured. For this, at least one of the micro-columns has a micro-column diameter varying along the micro-column longitudinal extension of the micro-column. Variation of the micro-column diameter is achieved, for example, by varying the electric current used with the PAECE method.

For example, the micro-column diameter increases or decreases continuously in one direction. The micro-column is conically tapered. It is also conceivable for the micro-column diameter to vary periodically. It is also conceivable for the micro-column diameter at the end of the micro-columns to be higher than it is in the middle the micro-columns. The result is micro-columns which are thicker at their ends. In all the exemplary embodiments described here, an averaged micro-column diameter is used to calculate the aspect ratio.

The micro-structures described can be used in the most diverse of fields depending inter alia on the micro-column materials used, the functional layers present or the micro-structure carrier used.

For example, the micro-structure with which the micro-column material is electrically conductive can be used as an electrode. The electrical connection between the micro-columns is, for example, provided by a carrier or a functional layer with electrically conductive material. The result is an electrode with an extremely large surface. This electrode is, for example, used in a capacitor.

It is also conceivable for a thermoelement to be achieved with the aid of the functional layer. The micro-structure is used to detect thermal radiation. The fine grid spacing of the micro-structure enables the thermal radiation to be detected with a higher spatial resolution.

A micro-structure with corresponding thickening at the end of the micro-columns can, on the other hand, be used as a mechanical connecting element.

To summarize, the proposals have the following advantages:

A micro-structure with an extremely large surface is accessible.

The micro-structure has self-supporting micro-columns. Therefore, it does not require a bearing surface to support the micro-structure.

The micro-structure can be produced selectively and in a controlled manner.

There are numerous possibilities for changing the properties of the micro-structure. This means the micro-structures can be adapted to a plurality of possible applications.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 9 and 10 show methods for producing micro-structures with structured micro-columns.

DETAILED DESCRIPTION OF THE PREFERRED EMBODIMENT

Figure 1:
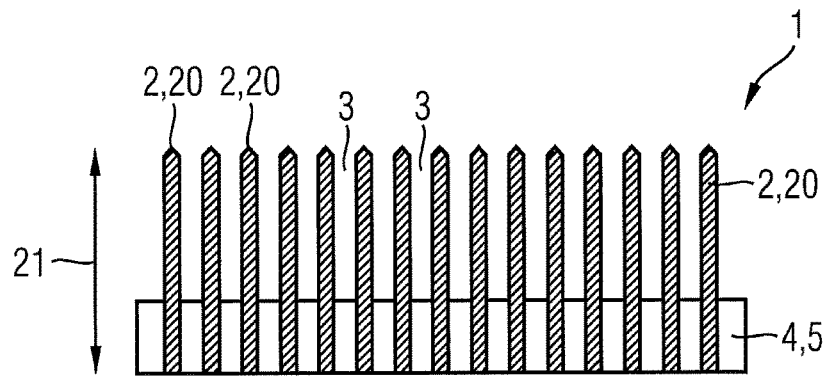
FIGS. 1 and 2 respectively show a micro-structure from the side.

Reference will now be made in detail to the preferred embodiments of the present invention, examples of which are illustrated in the accompanying drawings, wherein like reference numerals refer to like elements throughout.

Figure 16:
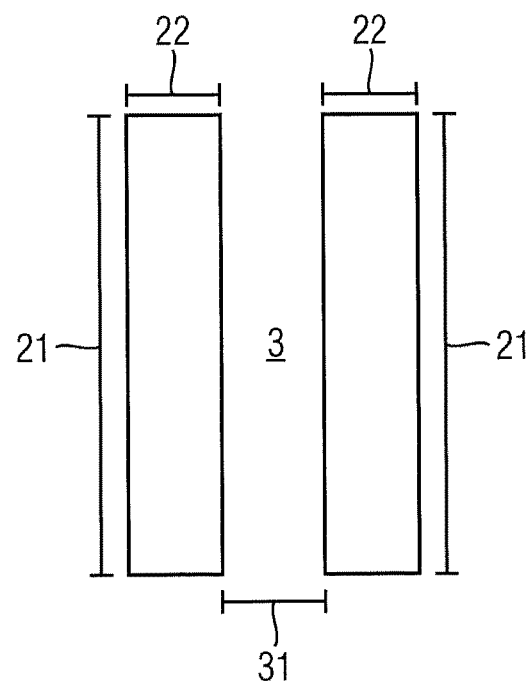
FIG. 16 shows two adjacent micro-columns of a micro-structure.

The subject matter of the following examples is respectively a three-dimensional micro-structure 1 comprising a plurality of adjacent micro-columns 2 which are arranged at a distance from each other and substantially parallel in relation to the respective longitudinal extension 21 with at least one micro-column material 20 having respectively an aspect ratio in the region of 20 to 1000 and respectively a micro-column diameter 22 (see FIG. 16) in the region of 0.1 µm to 200 µm. A micro-column intermediate chamber 3 is present between adjacent micro-columns. The micro-column intermediate chamber has a micro-column distance 31 between adjacent micro-columns in the region of 1 µm to 100 µm.

Figure 2:
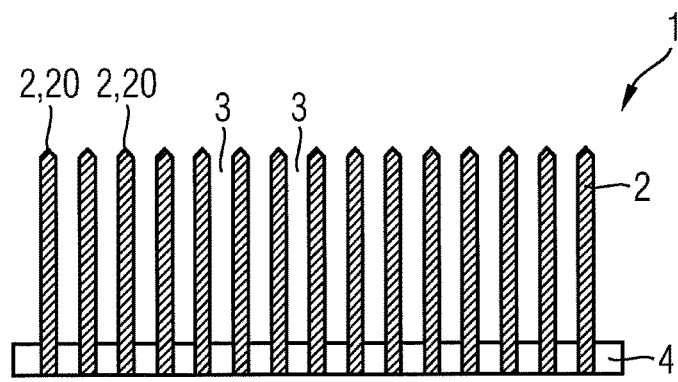
Figure 3:
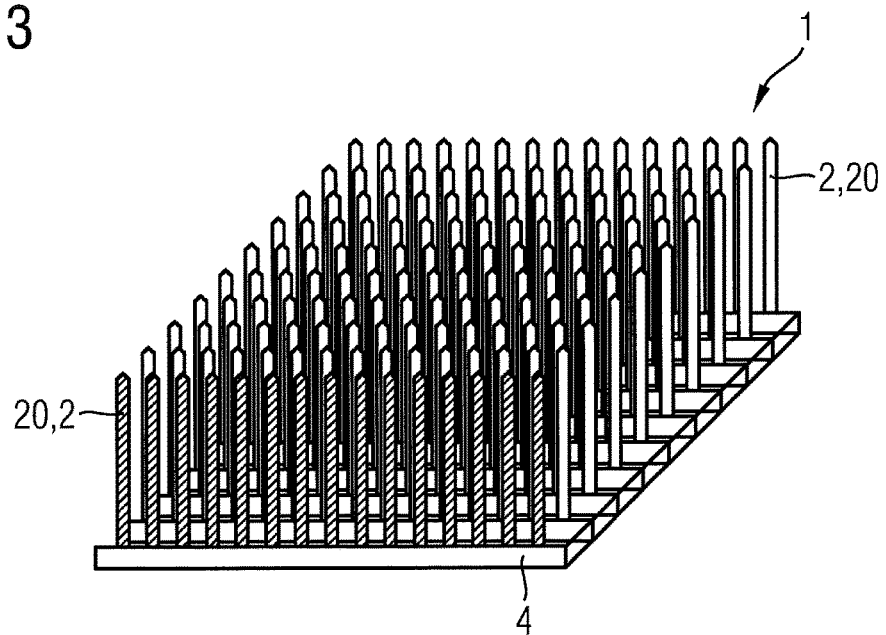
FIG. 3 shows a micro-structure in a perspective view.

The micro-structure is connected to a carrier (substrate) 4, which is obtained from the template 5 used by the partial removal of the template material (FIG. 1). In an alternative embodiment, the micro-structure remains on a carrier 4, which, was connect to the template during the course of the production procedure. The template material is completely removed. The micro-structure remains on the carrier (FIGS. 2 and 3).

Figure 4:
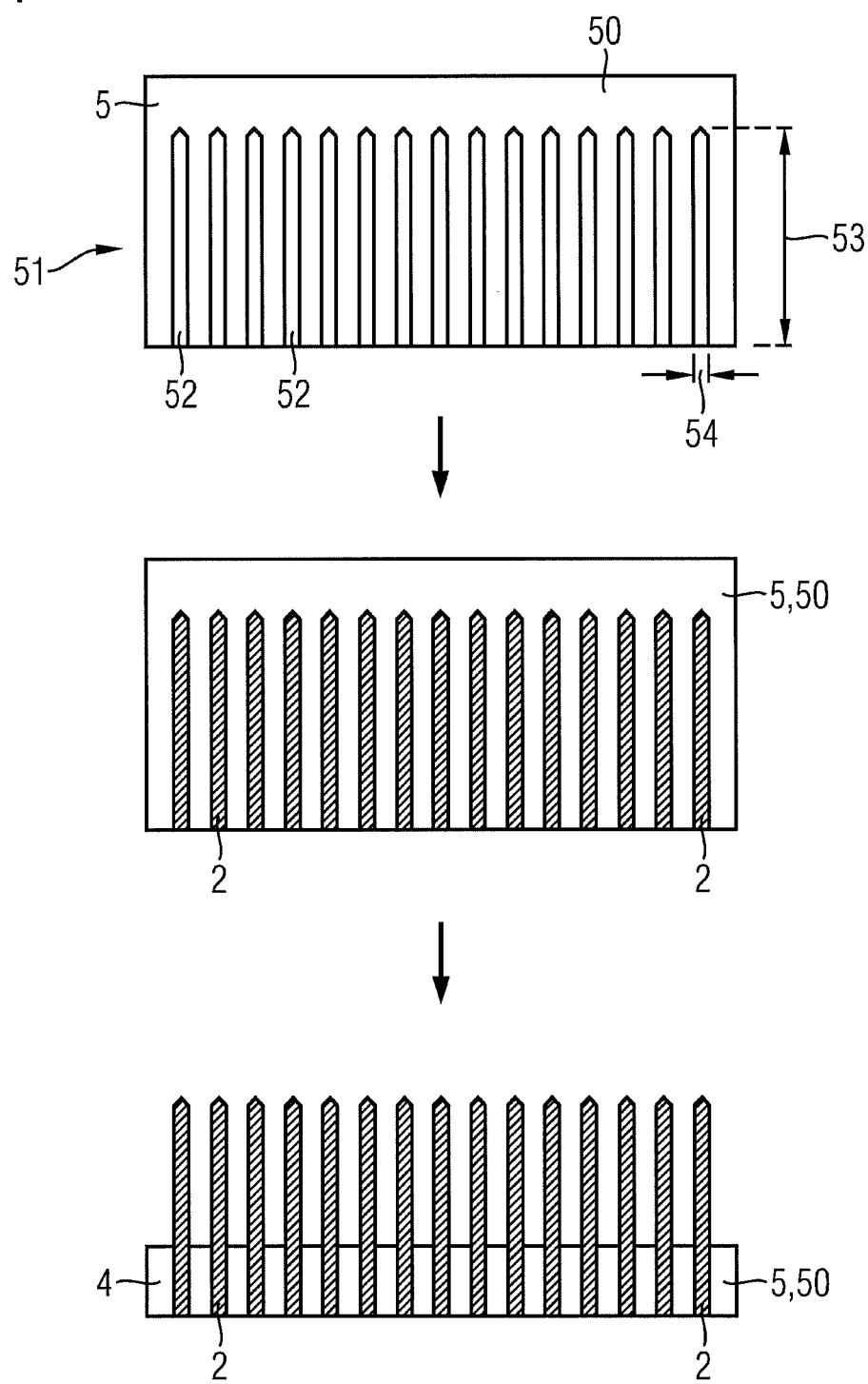
FIG. 4 shows the basic method for producing the micro-structure.

The three-dimensional micro-structure is produced using the following steps (FIG. 4):

a) the provision of a template 5 with template material 50, wherein the template has a three-dimensional template structure 51 with column-like cavities 52 which is substantially inverse to the micro-structure, b) the arrangement of micro-column material in the column-like cavities so that the micro-columns are formed and c) the at least partial removal of the template material.

The starting point is a silicon wafer. This silicon wafer serves as a template. The template material is silicon. The PAECE method is used to introduce the template cavities into the silicon wafer. The template cavities are introduced with a cavity longitudinal extension 53 and a cavity diameter 54 corresponding to the micro-columns to be produced. The distances between the template cavities are selected in accordance with the distances between the micro-columns.

Figure 5:
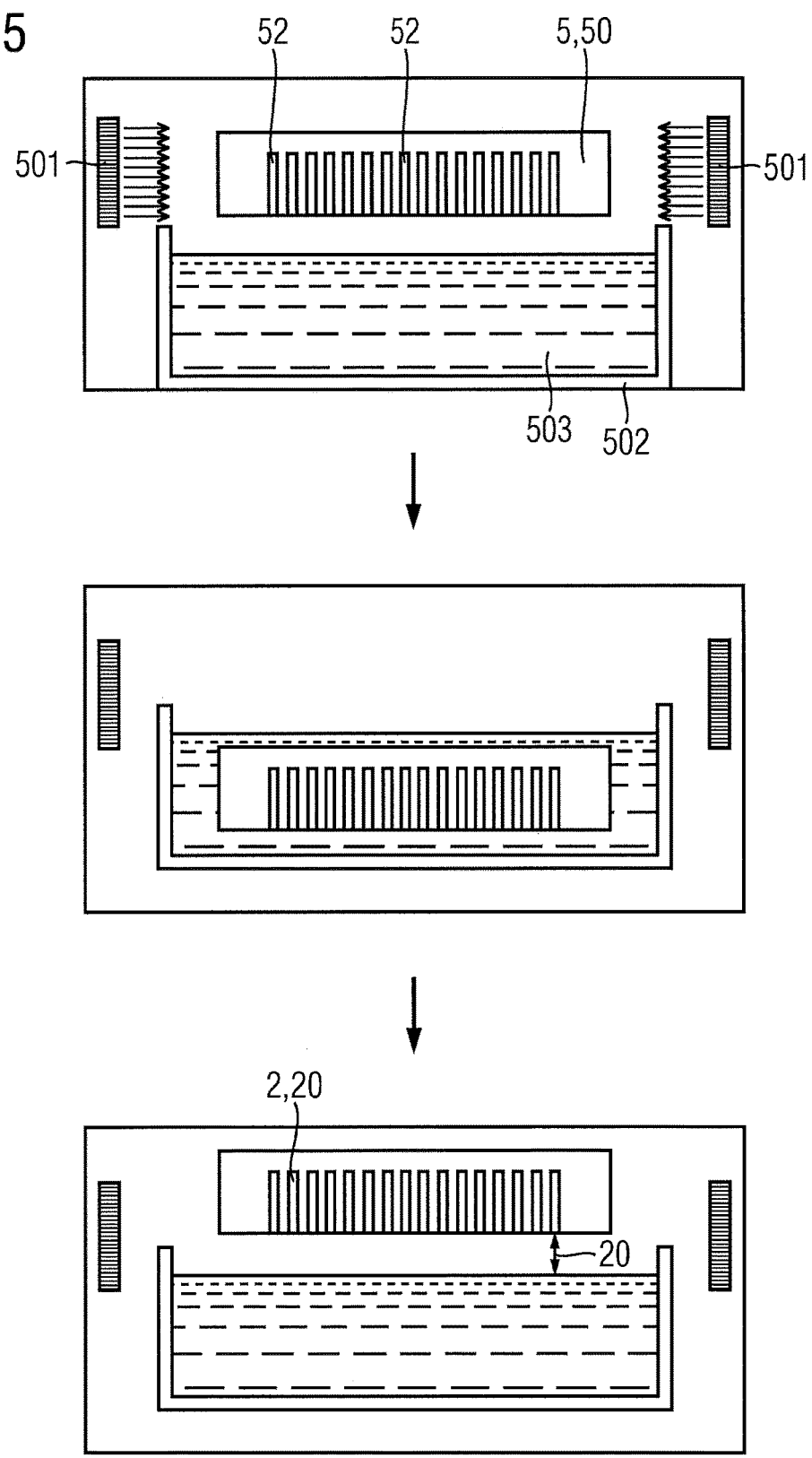
FIG. 5 shows a method for filling template cavities of a template.

Then, the column-like template cavities are filled with liquid micro-column material. An example of this process in shown in FIG. 5: the template with the template cavities is heated with the aid of the heating elements 501 and immersed in a reservoir 502 with liquid metal 503. Variation of an external pressure ensures that the liquid metal penetrates the template cavities. Then, the template with the filled template cavities is removed from the reservoir. The template cools down. As a result, the metal solidifies in the template cavities. The micro-columns are formed from the metal. The liquid metal serves as a starting material for the micro-column material. It is converted to the micro-column material (solid metal) by cooling.

EXAMPLE 1

Figure 6:
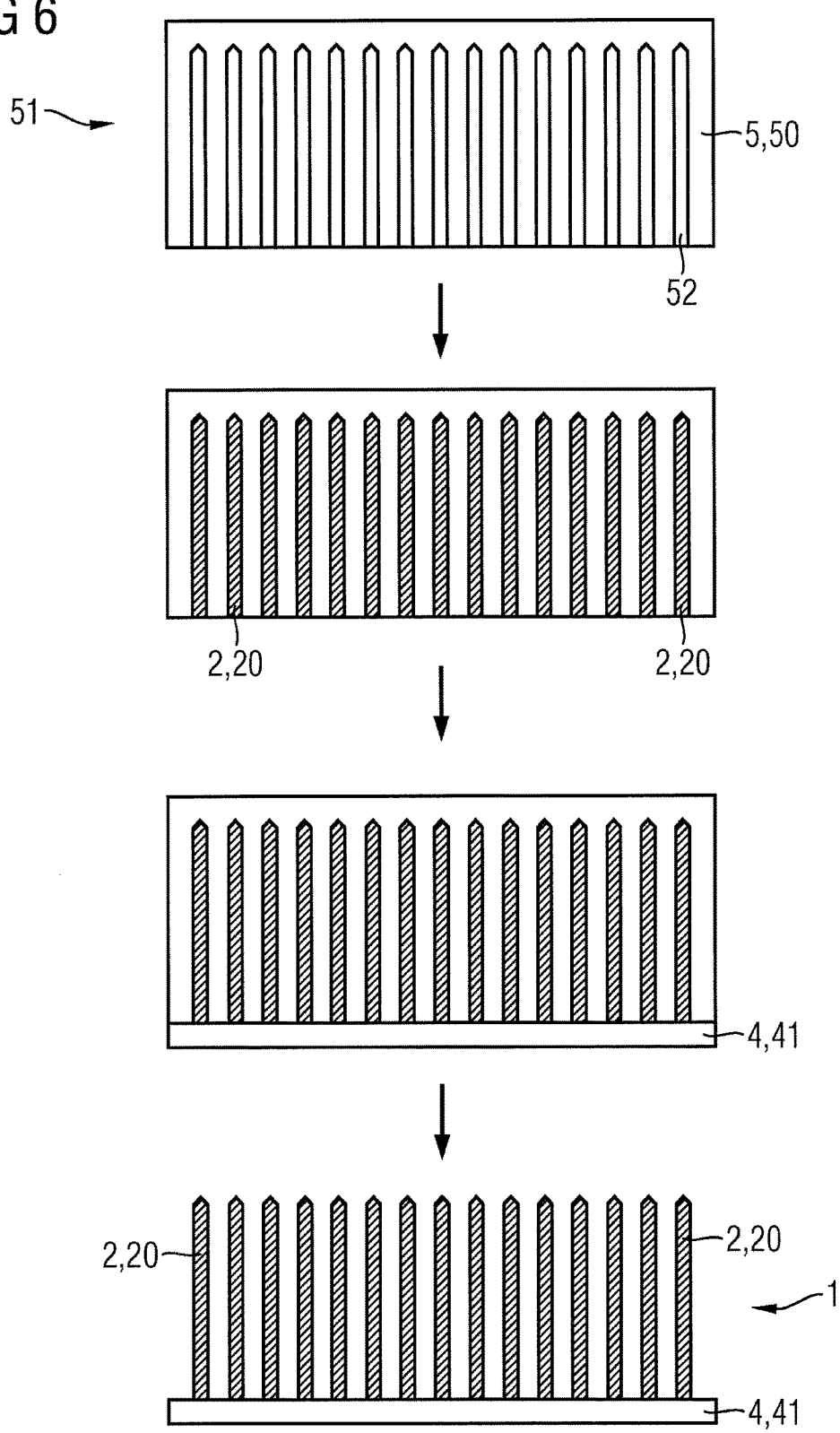
FIG. 6 shows a method for the arrangement of a micro-structure on a carrier.

A micro-structure is produced on a carrier 4 (FIG. 6). For this, a template with a template structure with template cavities is provided in which, as described above, micro-columns with micro-column material are arranged. Then, a carrier is arranged thereon so that the micro-columns are connected to the carrier. Then, the template material is almost virtually completely removed. The micro-structure with the micro-columns arranged on the carrier remains.

According to this example, the carrier is made of a rigid carrier material 41. The carrier material is a ceramic. In an alternative embodiment, the carrier material is a metal.

EXAMPLE 2

Figure 7:
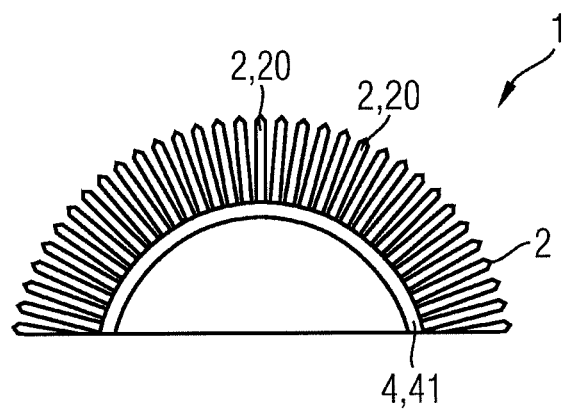
FIG. 7 shows a micro-structure on an elastic carrier.

In contrast to example 1, a carrier with elastomeric carrier material is used. The elastomeric carrier material is rubber. The carrier made of rubber is elastically deformable (FIG. 7).

EXAMPLE 3

According to this example, intermediate chamber material 33 is arranged in the micro-column intermediate chambers. The intermediate chamber material forms an intermediate chamber layer 32, with the aid of which the micro-columns are held in a fixed manner, i.e. are held against each other.

Figure 8:
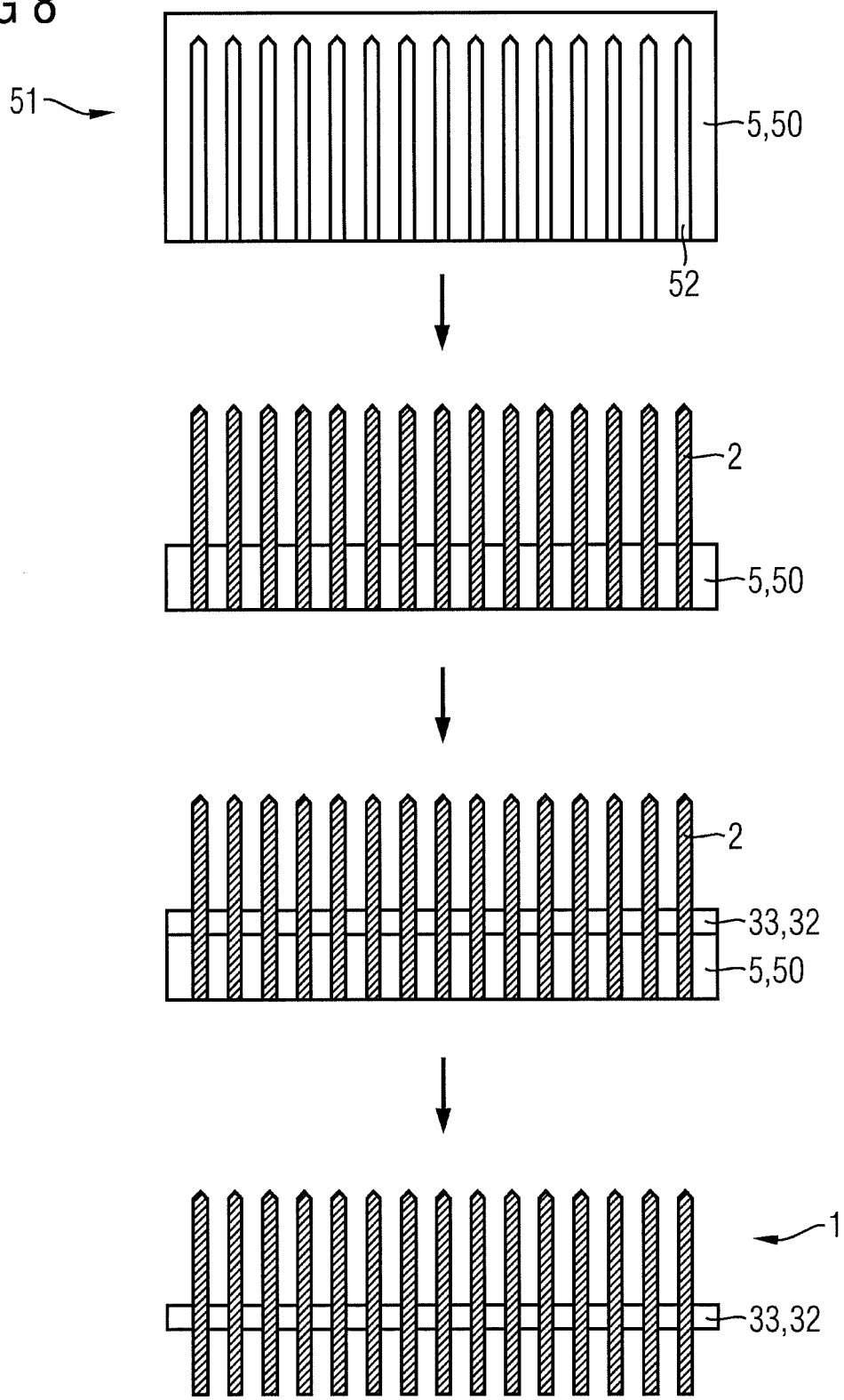
FIG. 8 shows a method for producing a micro-structure with an intermediate chamber layer.

For this, following the formation of the micro-columns in the template cavities, the template material is partially removed (FIG. 8). Then, the intermediate chamber material is arranged in the intermediate chambers between the adjacent micro-columns such that the intermediate chamber layer is formed. Finally, the remaining template material is removed. The micro-structure, whose micro-columns are fixed by the intermediate chamber layer remains.

EXAMPLE 4

Figure 9:
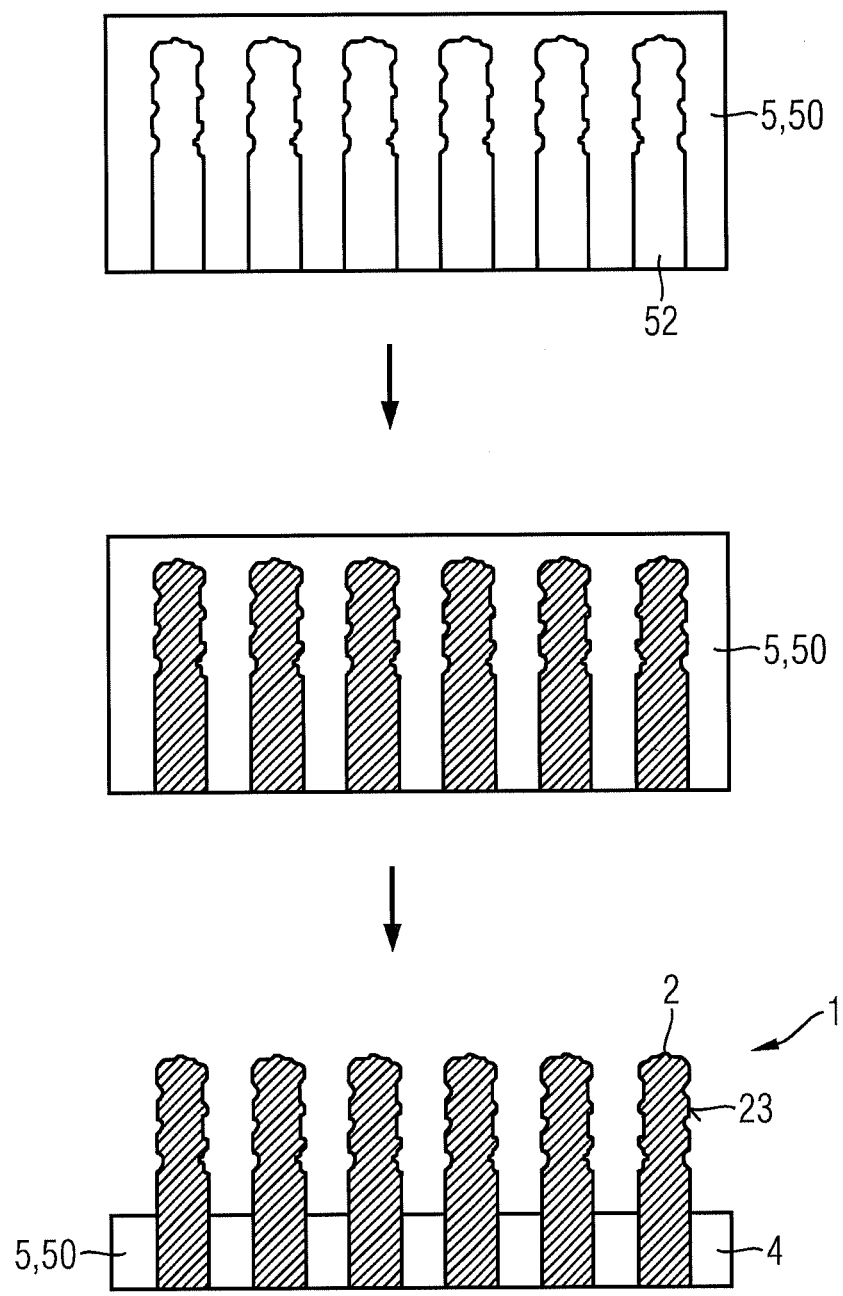

A micro-structure with micro-columns is produced with structured micro-column surfaces 23. For this, a template is used with template cavities, which have a template cavity diameter along the template cavity longitudinal extension (FIG. 9).

Following the arrangement of the corresponding micro-column material in the structured template cavities and the partial removal of the template material, the result is a micro-structure with micro-columns with structured micro-column surfaces. The remaining template functions as a carrier.

EXAMPLE 5

A micro-structure is produced in which enclosures 27 are arranged at the ends 26 of the micro-columns (FIG. 10). Here, once again, the micro-column surfaces are structured. The enclosures are applied using a PVD method following the partial removal of the template material. The enclosures function as a functional layer 28. Depending upon the desired function, any functional layers with the most diverse functional materials 280 are applied. For example, a micro-structure with micro-columns, which are thickened at the ends, can be used as a connecting element. An interleaved arrangement of two such micro-structures creates a non-positive contact between the two micro-structures. Here, the micro-columns of one micro-structure protrude into the micro-column intermediate chambers of the other micro-structure and vice versa.

In an alternative embodiment to this, the enclosures are applied by electrochemical deposition. For this, the micro-column material is electrically conductive. The micro-columns function for example as a cathode on the micro-column surfaces of which a metal such as copper is deposited electrochemically. In this case, the micro-structure is embodied as an electrode. This electrode can be used as a capacitor electrode of a capacitor.

EXAMPLE 6

Figure 11:
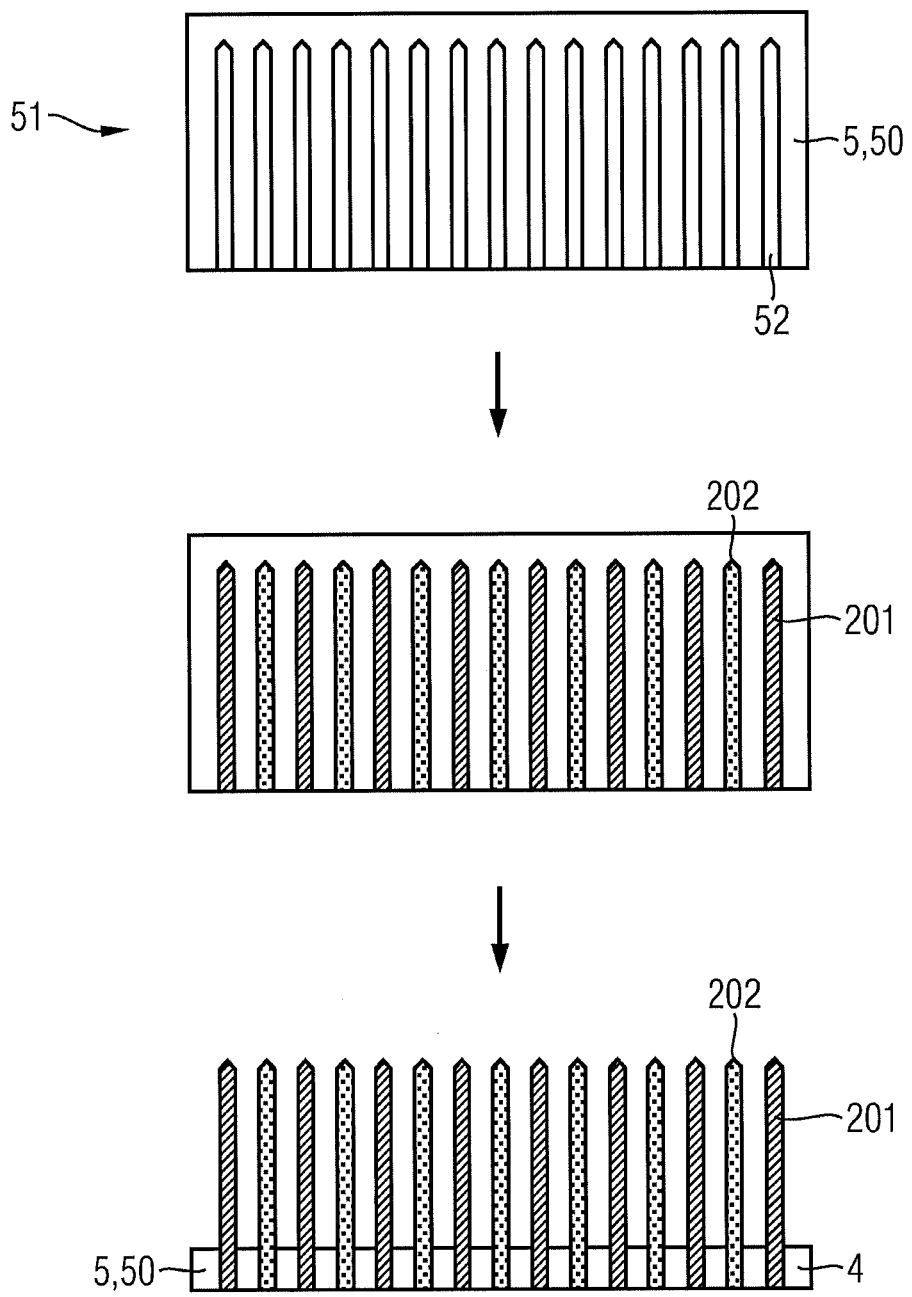
FIG. 11 shows a method for producing a micro-structure comprising micro-columns with different micro-column materials.

A micro-structure with micro-columns is produced with different micro-column materials 201 and 202 varying from micro-column to micro-column (FIG. 11). The micro-structure comprises micro-columns with micro-column material 201 and micro-columns with a further micro-column material 202 which differs from the micro-column material.

For this, the template cavities are filled with different starting materials for the different micro-column materials. The outcome is that the respective template cavities which are not to be filled are covered.

After the conversion of the starting material into the micro-column materials, the template material is again partially removed. The rest of the template remains as the carrier of a micro-structure with two groups of micro-columns with different micro-column materials.

EXAMPLE 7

Figure 12:
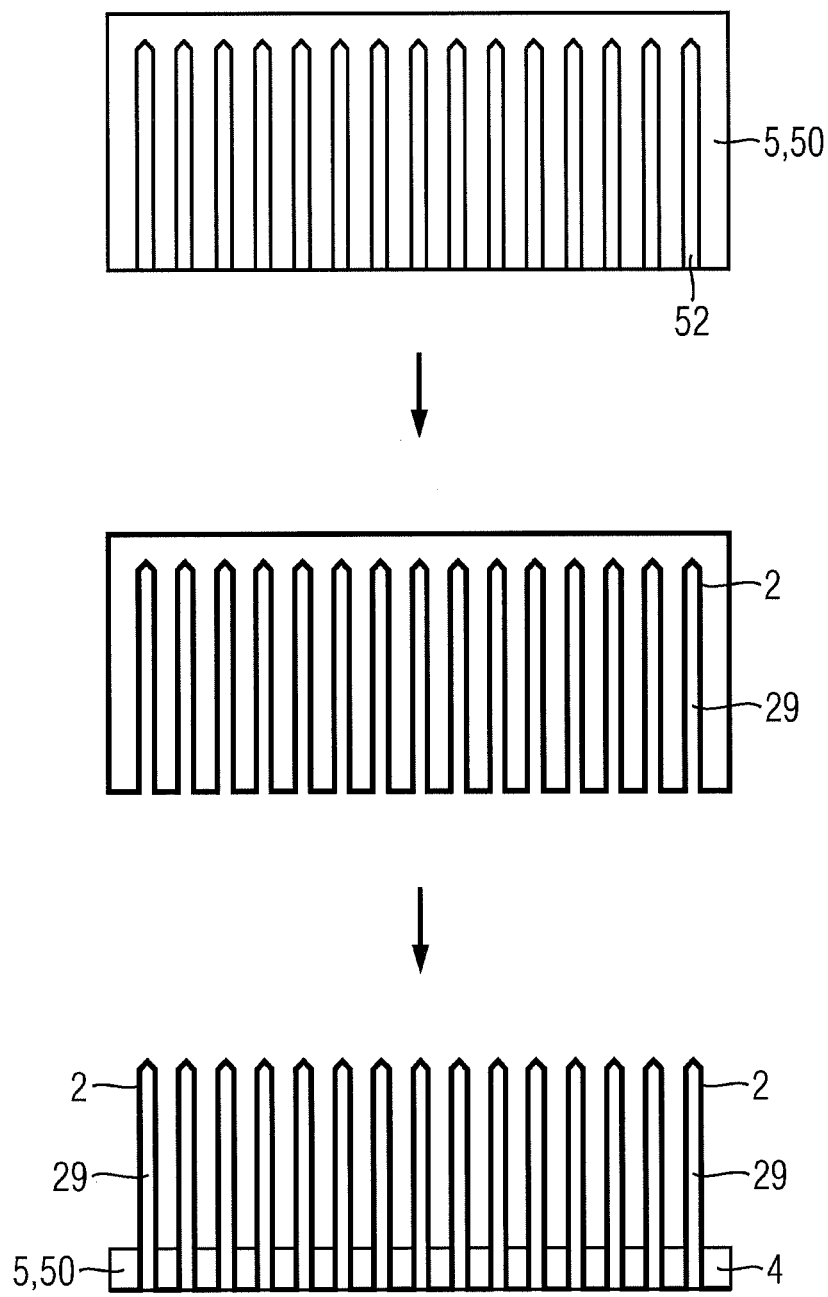
FIG. 12 shows methods for producing a micro-structure with hollow micro-columns.

A micro-structure with micro-columns comprising micro-structure-cavities 29 is produced. The micro-structure comprises hollow needles (FIG. 12).

For this, the template cavities are lined with the starting material of the micro-column material. The starting material is only arranged on a cavity surface. The following conversion of the starting material results in micro-columns comprising a micro-column wall made of the micro-column material. Otherwise, the micro-columns are hollow.

Then, the template material is again partially removed. What remains is a micro-structure with micro-columns in the form of hollow needles, which are arranged on substrate made of the template material.

EXAMPLE 8

Figure 13:
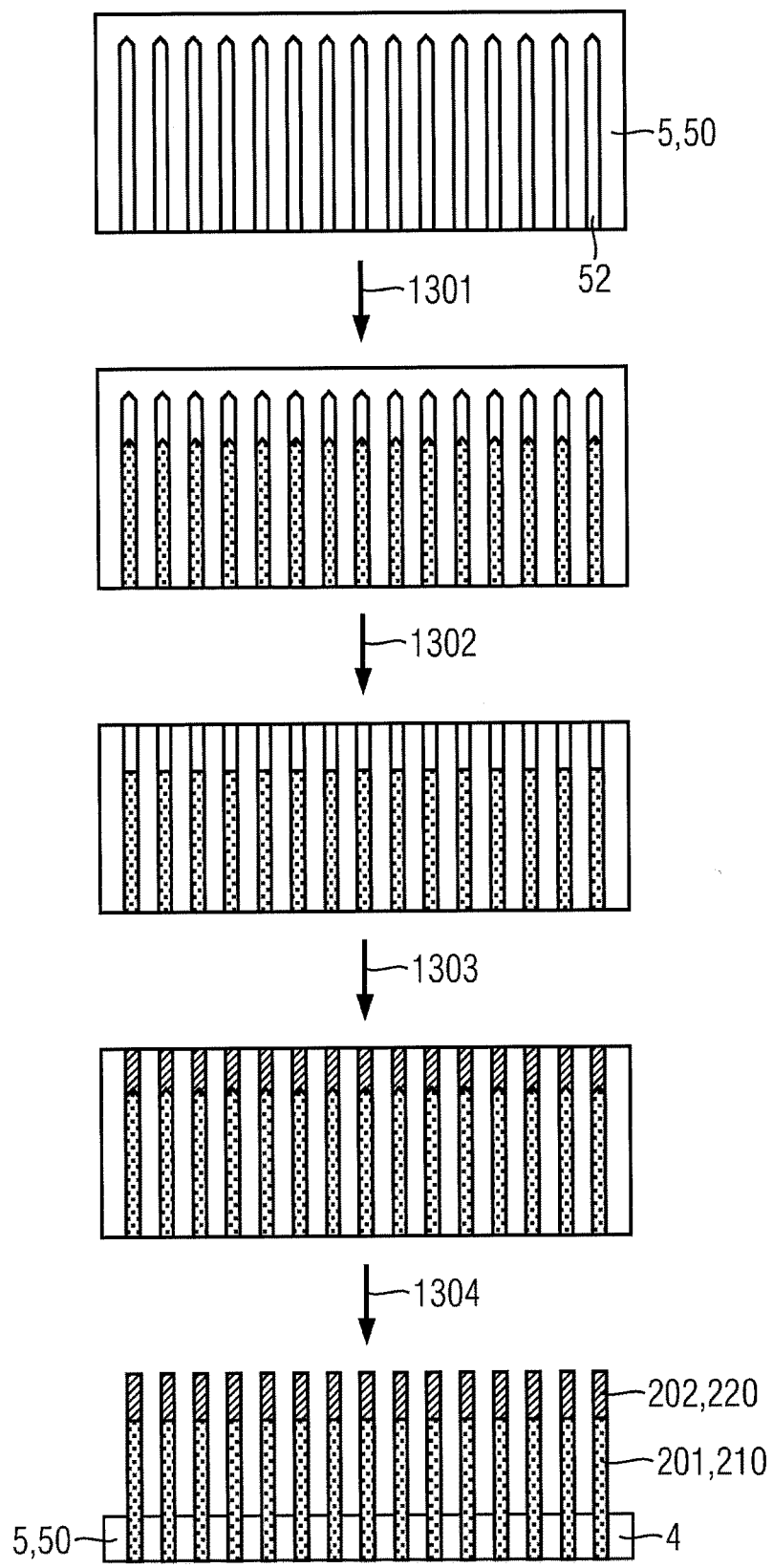
FIG. 13 shows a method for producing a micro-structure with which each of the micro-columns comprises a plurality of different micro-column materials.

A micro-structure is produced in which the individual micro-columns are made of different micro-column materials. Arranged along the micro-column longitudinal extension are a section 210 with micro-column material 201 and a further section 220 with a further micro-column material which is different from the micro-column material 202 (FIG. 13).

Starting from the template 5, the template cavities are first filled from the open side with the starting material for one of the micro-column materials. After the conversion of the starting material into the corresponding micro-column material (Step 1301), template material is removed from the closed side of the template until the template cavities are exposed (Step 1302). Then, starting material for the further micro-column material differing from the micro-column material is poured in and converted into the corresponding micro-column material (Step 1303). Finally, the template material is again partially removed (Step 1304).

EXAMPLE 9

Figure 14:
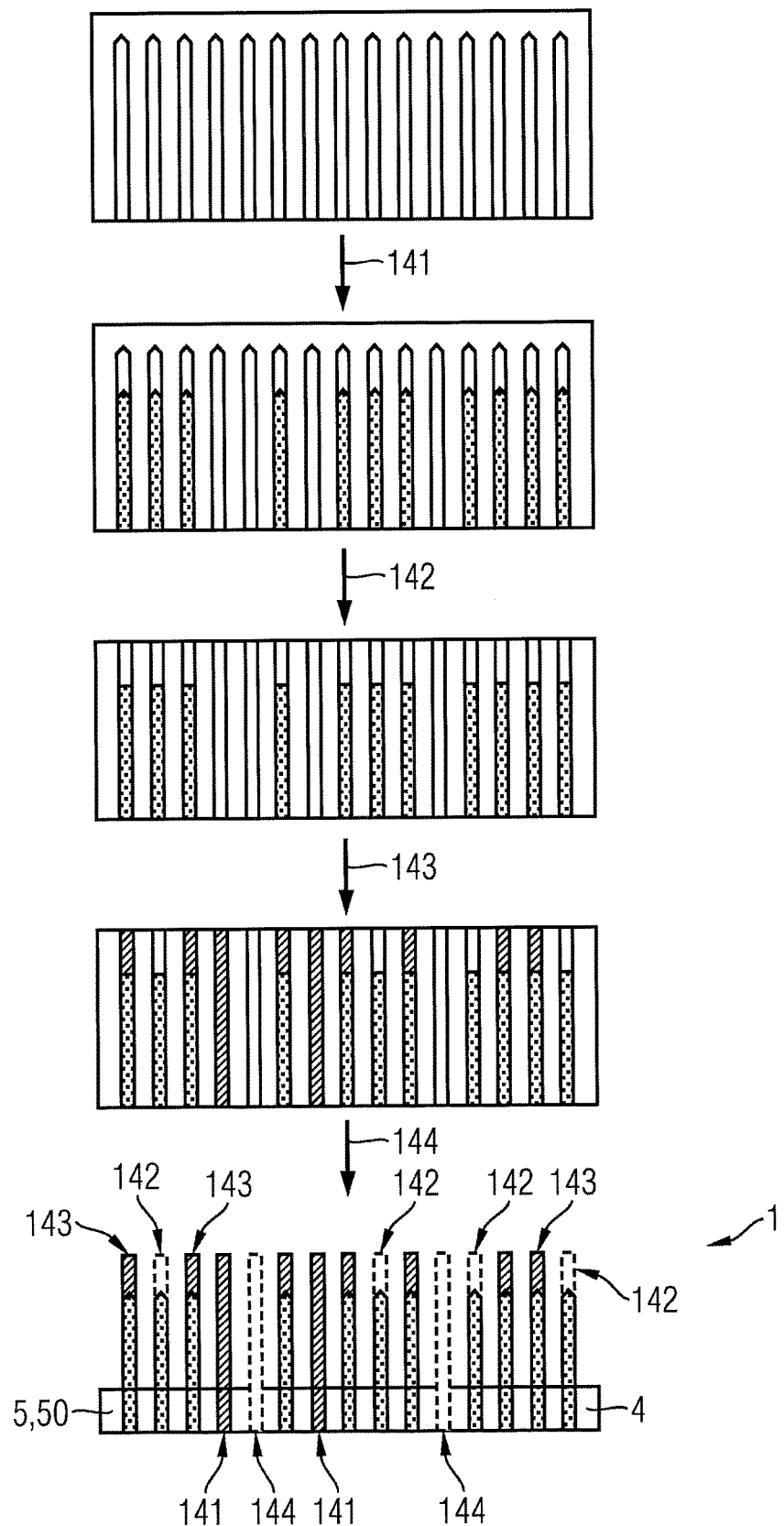
FIG. 14 shows a method with which a micro-structure is produced with different micro-structure regions.

This example represents a combination of the examples described above. A suitable sequence of the above-described steps enables the production of a micro-structure with different regions (FIG. 14): micro-columns 141, 142 with respectively only one type of micro-column material, but which are different from each other. In addition, the micro-columns 141 and 142 have different lengths. They have different micro-column longitudinal extensions. In addition, there are micro-columns 143, with different micro-column materials along their micro-column longitudinal extension. Finally, there are regions 144 in which no micro-columns at all are present.

The procedure for the production of the described microstructure is as follows: firstly, micro-columns with a first micro-column material are only arranged in selected template cavities (Step 141). For this, the template cavities in which these micro-columns are not to be arranged are covered. The open template cavities are filled with the starting material for the corresponding micro-column material.

Following the conversion of the starting material into the micro-column material, template material is removed from the closed side (Step 142). The template cavities are exposed. The template cavities which are not to be filled with any starting material for the further micro-column material are now covered. After the conversion of this starting material into the further micro-column material (Step 143) and the subsequent partial removal of the template material (Step 144) a microstructure as described above is obtained with which the micro-columns are arranged on a substrate made of the template material.

Figure 15:
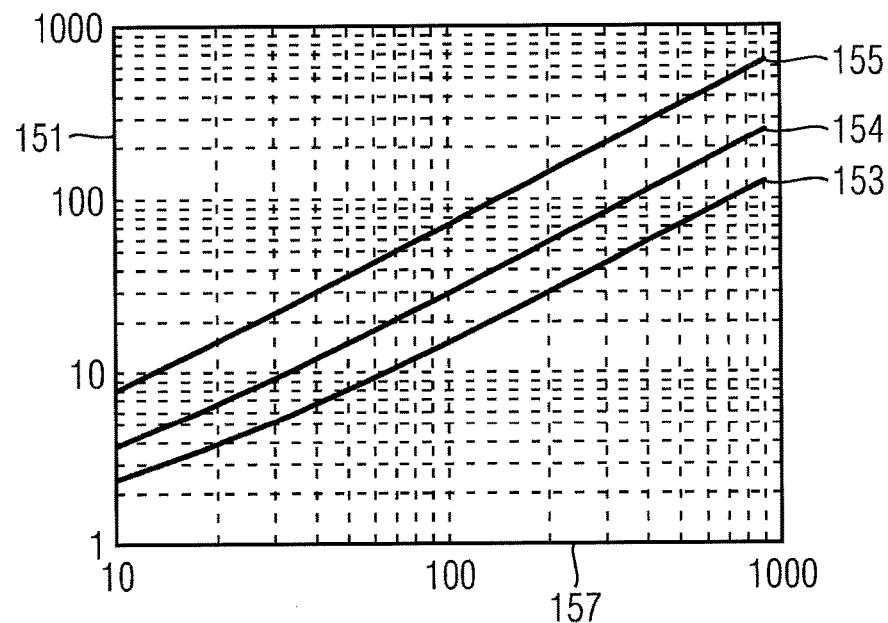
FIG. 15 shows a diagram with the dependence of the micro-column surface on the micro-column longitudinal extension with different micro-column diameters.

The described micro-structures are characterized by extremely large surfaces. This is made evident in FIG. 15. Here, the enlargement factor 151 is plotted against the micro-column longitudinal extension (152, needle length) for different micro-column diameters (needle diameters) and micro-column distances (needle-distances). The curve 153 refers to a micro-column diameter of 10 μm and a micro-column distance of 5 μm. The curves 154 and 155 refer to values of 5 μm and 2.5 μm and 2 μm and 1 μm respectively.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A thermoelement comprising:
   a plurality of adjacent, individually self-supporting longitudinally-extending micro-columns which are arranged physically separate from each other by a micro-column distance and substantially parallel to each other in a longitudinal direction, the micro-columns being made of amorphous metal or semimetal micro-column material, each of the micro-columns having an aspect ratio of from 20 to 1000 and a micro-column diameter of from 0.1 μm to 200 μm, wherein at least two of the plurality of micro-columns are formed respectively from different electrically conductive amorphous metal or semimetal micro-column materials; and
   a micro-column intermediate chamber arranged between adjacent micro-columns, the chamber having a width substantially equal to the micro-column distance between adjacent micro-columns, the micro-column distance being selected from 1 μm to 100 μm;
   wherein the micro-column intermediate chamber between adjacent micro-columns is at least partially filled with an intermediate chamber material to define an intermediate chamber layer;
   wherein the intermediate chamber layer extends longitudinally along only a partial portion of the longitudinal lengths of the micro-columns; and
   wherein the intermediate chamber layer is formed from an elastic, ceramic, or metal material and forms a common physical carrier that physically supports the plurality of micro-columns without additional structural support and wherein the thermoelement configured to detect thermal radiation.

2. The thermoelement as claimed in claim 1, wherein the micro-column diameter is selected from 0.3 μm to 200 μm.

3. The thermoelement as claimed in claim 1, wherein at least a portion of the micro-columns have a longitudinal height of from 50 μm to 10 mm.

4. The thermoelement as claimed in claim 1, wherein the micro-columns have a longitudinal height of from 100 μm to 1 mm.

5. The thermoelement as claimed in claim 1, wherein at least a portion of the micro-columns comprise at least two sections arranged along the longitudinal direction with different amorphous micro-column materials respectively forming the at least two sections.

6. The thermoelement as claimed in claim 1, wherein at least a portion of the micro-columns are at least partially enclosed with an enclosure material, and the micro-column material of the micro-columns and the enclosure material are different from each other.

7. The thermoelement as claimed in claim 1, wherein the micro-column intermediate chamber between adjacent micro-columns is at least partially filled with at least two intermediate chamber materials, and each of the intermediate chamber materials forms a coherent intermediate chamber layer.

8. The thermoelement as claimed in claim 1, wherein at least a portion of the micro-columns are partially hollow and have a micro-column cavity.

9. The thermoelement as claimed in claim 1, wherein at least a portion of the micro-columns have a micro-column diameter that varies along the longitudinal direction of the micro-columns.

10. The thermoelement as claimed in claim 1, wherein the intermediate chamber layer forming the common carrier for the plurality of micro-columns is formed of an elastomeric carrier material that is elastically deformable.

11. The thermoelement as claimed in claim 1, wherein a first portion of the micro-columns is attached to a first common carrier, a second portion of the micro-columns is attached to a second common carrier, the micro-columns attached to the first common carrier are arranged in the micro-column intermediate chambers formed by the micro-columns attached to the second common carrier, and the micro-columns attached to the second common carrier are arranged in the micro-column intermediate chambers formed by the micro-columns attached to the first common carrier.

12. The thermoelement as claimed in claim 11, wherein the micro-columns attached to the first common carrier are formed from a first micro-column material, and the micro-columns attached to the second common carrier are formed from a second micro-column material, different from the first micro-column material.

13. A method for producing a thermoelement, the method comprising:
providing a template formed of an elastic, ceramic, or metal template material, the template having a three-dimensional template structure with a plurality of column-like template cavities arranged substantially parallel to each other in a longitudinal direction, wherein adjacent column-like template cavities are separated from each other by a micro-column distance of from 1 μm to 100 μm, the template being a substantial inverse to a micro-structure of a plurality of longitudinally-extending micro-columns each having an aspect ratio of from 20 to 1000 and a micro-column diameter of from 0.1 μm to 200 μm;
inserting amorphous metal or semimetal micro-column material in the plurality of column-like template cavities so that the plurality of adjacent longitudinally-extending micro-columns are formed wherein; and
removing a portion of the template material such that a remaining portion of the template material in the micro-column intermediate chambers between the micro-columns defines an intermediate chamber layer, and such that each micro-column extends longitudinally from the intermediate chamber layer; wherein the intermediate chamber layer extends longitudinally only partially along the longitudinal lengths of the micro-columns, such that the intermediate chamber layer forms a common physical carrier that physically supports a first longitudinal portion of each micro-column without additional structural support, and such that a second longitudinal portion of each micro-column extends from the intermediate chamber layer and is individually self-supporting; and
wherein the thermoelement is configured to detect thermal radiation.

14. The method as claimed in claim 13, wherein inserting the amorphous metal or semimetal micro-column material comprises: introducing a starting material for the amorphous metal or semimetal micro-column material into the cavities; and converting the starting material for the amorphous metal or semimetal micro-column material into a microstructure material for the micro-columns.

15. The method as claimed in claim 13, wherein the elastic, ceramic, or metal template material comprises silicon.

16. A thermoelement comprising:
a plurality of adjacent, individually self-supporting longitudinally-extending micro-columns which are arranged physically separate from each other by a micro-column distance and substantially parallel to each other in a longitudinal direction, the micro-columns being made of amorphous metal or semimetal micro-column material, each of the micro-columns having an aspect ratio of from 20 to 1000 and a micro-column diameter of from 0.1 μm to 200 μm, wherein at least two of the plurality of micro-columns are formed respectively from different electrically conductive amorphous metal or semimetal micro-column materials; and
a micro-column intermediate chamber arranged between adjacent micro-columns, the chamber having a width substantially equal to the micro-column distance between adjacent micro-columns, the micro-column distance being selected from 1 μm to 100 μm;
wherein the micro-column intermediate chamber between adjacent micro-columns is at least partially filled with an intermediate chamber material to define an intermediate chamber layer;
wherein the intermediate chamber layer surrounds an outer circumference of each micro-column and extends longitudinally along a partial portion of the longitudinal length of each micro-column; and
wherein the micro-columns extend beyond the intermediate chamber layer in both opposing longitudinal directions and wherein the thermoelement is configured to detect thermal radiation.

* * * * *